(12) United States Patent
Andrei

(10) Patent No.: US 8,848,394 B2
(45) Date of Patent: Sep. 30, 2014

(54) RADIO FREQUENCY CIRCUIT WITH IMPEDANCE MATCHING

(75) Inventor: Cristian Andrei, Cambes en Plaine (FR)

(73) Assignee: NXP B.V., Eindhoven (NL)

(*) Notice: Subject to any disclaimer, the term of this patent is extended or adjusted under 35 U.S.C. 154(b) by 178 days.

(21) Appl. No.: 13/308,229

(22) Filed: Nov. 30, 2011

(65) Prior Publication Data

US 2012/0140432 A1 Jun. 7, 2012

(30) Foreign Application Priority Data

Dec. 1, 2010 (EP) .................................. 10290632

(51) Int. Cl.
| H05K 9/00 | (2006.01) |
| H03F 1/56 | (2006.01) |
| H03F 1/26 | (2006.01) |
| H03F 3/195 | (2006.01) |

(52) U.S. Cl.
CPC .................. H03F 1/565 (2013.01); H03F 1/26 (2013.01); H03F 3/195 (2013.01)
USPC ........... 361/818; 361/816; 361/817; 174/257; 455/248.1

(58) Field of Classification Search
CPC ............ H03F 1/26; H03F 1/565; H03F 3/195
USPC ......... 361/816, 817, 818; 455/248.1; 174/257
See application file for complete search history.

(56) References Cited

U.S. PATENT DOCUMENTS

| 3,889,129 | A | * | 6/1975 | Menzel et al. ................. 307/105 |
| 5,640,457 | A | * | 6/1997 | Gnecco et al. ................. 381/322 |
| 6,133,787 | A | * | 10/2000 | Yerkovich et al. .............. 330/68 |
| 6,429,502 | B1 | * | 8/2002 | Librizzi et al. ................. 257/510 |
| 6,580,931 | B1 | * | 6/2003 | Shiotsu et al. ............. 455/575.1 |
| 6,888,063 | B1 | * | 5/2005 | Lien et al. ...................... 174/394 |
| 7,317,618 | B2 | * | 1/2008 | Robinson et al. ............. 361/719 |
| 7,463,496 | B2 | * | 12/2008 | Robinson et al. ............. 361/818 |
| 7,512,389 | B2 | * | 3/2009 | Desclos .................... 331/117 R |

(Continued)

FOREIGN PATENT DOCUMENTS

WO 2008/112611 9/2008

OTHER PUBLICATIONS

Girlando, G. et al. "Noise Figure and Impedance Matching in RF Cascode Amplifiers", IEEE Transactions on Circuits and Systems-II: Analog and Digital Signal Processing, vol. 46, No. 11, pp. 1388-1396 (Nov. 1999).

(Continued)

*Primary Examiner* — David M Sinclair
*Assistant Examiner* — Robert Brown

(57) ABSTRACT

A radio frequency (RF) circuit is configured for impedance matching, such as for mitigating noise. In connection with an example embodiment, an RF circuit includes a transceiver in a substrate, and a conductive ring-type of material in the substrate and around at least a portion of the transceiver circuit. An upper conductive ring material is over the substrate and separated from the conductive ring-type material by an insulating layer. The upper conductive ring material is configured to generate an inductance that matches input impedance characteristics of the transceiver circuit. In some implementations, the upper conductive ring material connects a gate input pin of the circuit with the gate of an input transistor of an amplifier in the transceiver, and exhibits an impedance that matches the impedance of the input transistor.

5 Claims, 6 Drawing Sheets

(56) References Cited

U.S. PATENT DOCUMENTS

| | | | |
|---|---|---|---|
| 7,534,968 B2* | 5/2009 | English et al. | 174/382 |
| 7,928,925 B2* | 4/2011 | Zhu et al. | 343/841 |
| 7,949,322 B2 | 5/2011 | Kim et al. | |
| 8,359,076 B2* | 1/2013 | Zhu et al. | 455/575.5 |
| 8,487,416 B2* | 7/2013 | Delgado et al. | 257/659 |
| 2001/0002060 A1* | 5/2001 | Forbes | 257/528 |
| 2006/0071735 A1 | 4/2006 | Kang | |
| 2007/0139129 A1* | 6/2007 | Park | 331/152 |
| 2008/0080160 A1* | 4/2008 | English et al. | 361/818 |
| 2008/0220735 A1* | 9/2008 | Kim et al. | 455/150.1 |
| 2009/0168329 A1* | 7/2009 | Ellis | 361/679.46 |
| 2009/0257207 A1* | 10/2009 | Wang et al. | 361/752 |
| 2009/0302976 A1 | 12/2009 | Cho | |
| 2010/0102885 A1 | 4/2010 | Heston et al. | |
| 2010/0109081 A1* | 5/2010 | Chen et al. | 257/336 |
| 2010/0218987 A1* | 9/2010 | Tracy et al. | 174/350 |
| 2011/0013789 A1* | 1/2011 | Chen | 381/189 |
| 2011/0032622 A1* | 2/2011 | Kim et al. | 359/609 |
| 2012/0236528 A1* | 9/2012 | Le et al. | 361/818 |
| 2013/0044031 A1* | 2/2013 | Hsu et al. | 343/700 MS |

OTHER PUBLICATIONS

Miliozzi, P. et al. "A Design System for RFIC: Challenges and Solutions", Proceedings of the IEEE, vol. 88, No. 10, pp. 1613-1632 (Oct. 1, 2000).

Tummala R. R. et al. "Gigabit Wireless: System-on-a-Package Technology", Proceedings of the IEEE, vol. 92, No. 2, pp. 376-387 (Feb. 1, 2004).

Deen M. J. et al. "High-Frequency Noise of Modern MOSFETS: Compact Modeling and Measurement Issues", IEEE Transactions on Electron Devices, vol. 53, No. 9, pp. 2062-2081 (Sep. 2006).

Adabi, E. et al. "30 GHz CMOS Low Noise Amplifier", 2007 IEEE Radio Frequency Integrated Circuits Symposium, pp. 625-628 (Jun. 3, 2007).

Wu, D. et al. "A 0.4-V Low Noise Amplifier Using Forward Body Bias Technology for 5 GHz Application", IEEE Microwave and Wireless Components Letters, vol. 17, No. 7, pp. 543-545 (Jul. 2007).

Chang, C. W. et al. "A 2—11 GHz Fully-Integrated Low Noise Amplifier for WiMAX Systems", IEEE Conference on Electron Devices and Solid-State Circuits (EDSSC), pp. 441-444 (Dec. 20, 2007).

Sayag, A. et al. "A 25 GHz 3.3 db NF Low Noise Amplifer Based Upon Slow Wave Transmission Lines and the 0.18 μm CMOS Technology" IEEE Radio Frequency Integrated Circuits Symposium, pp. 373-376 (2008).

Chen, C. L. et al. "Wafer-Scale 3D Integration of Silicon-on-Insulator RF Amplifiers", IEEE Topical Meeting on Silicon Monolithic Integrated Circuits in RF Systems, SIRF '09, pp. 1-4, (Jan. 19, 2009).

Extended European Search Report for EP Patent Appln. No. 10290632.8 (May 12, 2011).

Kraus, J.D.; Radio Astronomy, McGraw-Hill; 1966, pp. 258-266.

\* cited by examiner

RADIO FREQUENCY CIRCUIT WITH IMPEDANCE MATCHING

This application claims the priority under 35 U.S.C. §119 of European patent application no. 10290632.8, filed on Dec. 1, 2010, the contents of which are incorporated by reference herein.

BACKGROUND OF THE INVENTION

Transceiver circuits used for a variety of applications, such as for radio frequency transmission, have seen significant growth in their use and demand in their capabilities. For amplifiers used in these circuits, high efficiency and small size are desirable, yet have been difficult to achieve as these goals can be contradictory. In addition, many integrated amplifiers made on semiconductor substrate and devices used for such amplifiers exhibit undesirably high radio frequency (RF) losses. For different signals processed using impedance transformation based circuits, problems can result from mutual coupling between the signals.

Low noise amplifiers (LNA) are used in many RF transceivers, to amplify analog signals received by an antenna. For these circuits, noise behavior can be difficult to address. In addition, many approaches to address noise can require a significant amount of space within the transceiver, which exacerbates size issues as discussed above.

These and other issues have presented challenges to the implementation of RF circuits, and particularly of RF circuits susceptible to noise in connection with various substrates.

SUMMARY OF THE INVENTION

Various example embodiments are directed to a high-frequency circuit that can be used to mitigate noise issues in a radio frequency (RF) transceiver, with particular embodiments directed to impedance-matching circuits, which address issues such as those discussed above.

In connection with an example embodiment, an RF circuit includes an active circuit in a substrate, and a conductive ring material in the substrate and around at least a portion of the active circuit. An upper conductive ring material is in a layer of material over the transceiver circuit and insulated from the conductive ring material by an insulating layer therebetween. The upper conductive ring material is configured to generate an inductance that matches input impedance characteristics of the active circuit.

Another example embodiment is directed to an impedance-matching circuit for an RF amplifier having an input transistor on a substrate and a conductive shielding material in the substrate and laterally around at least a portion of the input transistor. The impedance matching circuit includes, in a layer of insulating material offset from the substrate and the input transistor, an impedance-matching conductive material that is insulated from the conductive shielding material, connected to a gate of the input transistor, and exhibits an impedance that matches an impedance of the input transistor.

Another example embodiment is directed to method of manufacturing a transceiver circuit. At least one insulating layer is formed over a substrate having therein an active circuit and a conductive ring material laterally around the active circuit. An upper conductive ring material is formed in another layer over the substrate and insulated from the conductive ring material by the insulating layer. The upper conductive ring material is configured to generate an inductance that matches impedance characteristics of the active circuit.

The above discussion is not intended to describe each embodiment or every implementation of the present invention. The figures and detailed description that follow also exemplify various embodiments.

BRIEF DESCRIPTION OF THE DRAWINGS

Various example embodiments may be more completely understood in consideration of the following detailed description in connection with the accompanying drawings, in which.

Figure 1:
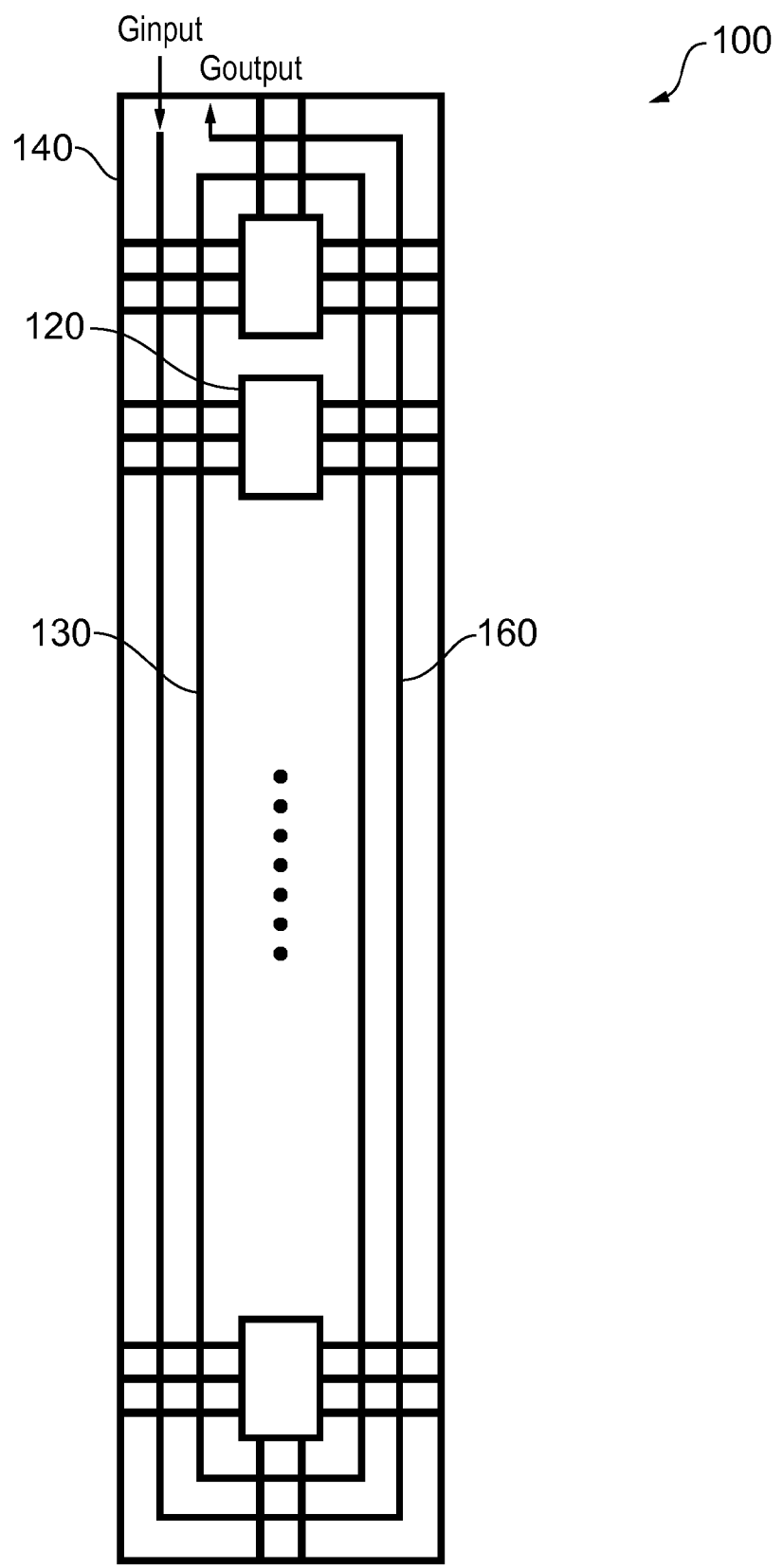
FIG. 1 shows an overhead view of an RF circuit 200 having an over-substrate ring for noise mitigation, in accordance with another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION OF EMBODIMENTS

The present invention is believed to be applicable to a variety of different types of processes, devices and arrangements for use with various circuits, including circuits for wireless communications and radio frequency (RF)/microwave applications. While the present invention is not necessarily so limited, various aspects of the invention may be appreciated through a discussion of examples using this context.

According to an example embodiment of the present invention, a ring-type conductor is implemented over a substrate having one or more transistors therein, to mitigate noise. The ring-type conductor may, for example, be located in a layer of material over the substrate and transistors, one to several layers above the substrate. The configuration and arrangement or the ring-type conductor is implemented to impart an inductance (e.g., to match impedance) that addresses noise-type issues such as those discussed above, via impedance matching. Various implementations are directed to the use of the ring-type conductor to match noise characteristics present in radio frequency devices, such as in RFMOS transistors.

In some embodiments, a noise mitigation circuit includes a high frequency (e.g., above 2 GHz) ring-type conductor located over corresponding conductors in an underlying substrate, for a multi-finger RFMOS transistor device. The high frequency conductor is arranged, relative to transistors in the device, to enhance RF noise capabilities of transistors in a particular RF range, and abroad the frequency of use. These RF noise capabilities may, for example, be referred to as a noise figure. In many implementations, the high frequency conductor facilitates a reduction in spacing between RF circuits in a substrate (e.g., silicon), by mitigating noise and/or other interference that would otherwise inhibit such spacing.

In another example embodiment, a high frequency conductor is shaped to match RF characteristics of a ring conductor in an underlying substrate and adjacent a transistor of an RF amplifier. The high frequency conductor is connected to a transistor gate, such as by assimilating the ring to a bent microstrip line having a terminal connected to a transistor gate, and another terminal used as an input pin for the gate. This approach is used to decrease the noise figure of the transistor, by matching the input impedance of the transistor with the high frequency conductor and enhancing the gain of the transistor. Such an approach may be implemented, for example, with low-noise amplifier circuits to match the input impedance of a first transistor stage thereof.

In a more particular embodiment, a high frequency conductor as discussed herein is employed with a low noise amplifier (LNA) for an RF transceiver having gain and noise characteristics that facilitate the detection and amplification of an analog signal received by an antenna. Noise behavior can be characterized by parameters including the noise figure (NF), the minimum noise figure (NFmin), the equivalent noise resistance (Rn), and the optimum noise impedance (Zopt). The noise figure of a two-port circuit depends on the impedance seen at its input and has a variation relative to frequency reflected by noise parameters. The minimum noise figure represents a minimum level of noise that can be reached when an optimum impedance (Gopt) is presented to the gate at a given frequency.

Where implemented with a metal-oxide-semiconductor (MOS) transistor used in an LNA, an equivalent input impedance close to Gopt is generated using a high frequency conductor over the substrate, as described herein. This technique involves decreasing the transistor's NF close to NFmin, and the gain can be correspondingly improved in the band where the noise is matched. In many implementations, the equivalent input impedance is generated to correspond to an impedance of a first input transistor (FIT) in the first stage of the LNA, to decrease the overall noise in the chain as defined by the Friis equation (see, e.g., J. D. Kraus, Radio Astronomy, McGraw-Hill, 1966).

For general information regarding CMOS devices, and for particular information regarding advanced CMOS processes to involving low noise and power consumption approaches that may be implemented in connection with one or more example embodiments described herein, reference may be made to Adabi, et al, "30 GHz CMOS Low Noise Amplifier," 2007 IEEE Radio Frequency Integrated Circuits (RFIC) Symposium, 3-5 Jun. 2007, pp. 625-628; and to Chang et al, "A 2-11 GHz Fully-Integrated Low Noise Amplifier for WiMAX Systems," IEEE Conference on Electron Devices and Solid-State Circuits (EDSSC), 20-22 Dec. 2007 pp.: 441-444. For additional information regarding noise matching, and for specific information regarding noise matching approaches that may be used in connection with one or more example embodiments, reference may be made to Girlando, et al, "Noise figure and impedance matching in RF cascode amplifiers," IEEE Transactions on Circuits and Systems II: Analog and Digital Signal Processing, Volume 46, Issue 11, pp. 1388-1396 (November 1999). Each of these documents is fully incorporated herein by reference.

In some implementations, a high frequency conductor as discussed herein is configured with an impedance, Gopt, which is set based upon a band frequency of an LNA and the size of a first input transistor for the LNA and corresponding transistor characteristics. Such characteristics may, for example, include those related to capacitance and resistance respectively dominated by gate to source extrinsic and intrinsic capacitance, as well as the backend and channel internal resistance. The geometry of the transistor may be set based upon a small or minimum noise figure attainable, and Gopt can be set corresponding to minimum series inductances and resistances.

In various contexts, the term "match" or variations thereof are used to refer to matching an impedance or other characteristic. In these contexts and as consistent with one or more embodiment, such a match does not necessarily involve an exact match as would be understood by one of skill in the art. For instance, circuits having a common shape naturally exhibit slight processing variations that result in relatively minor variations in characteristics such as resistance, impedance and others.

Turning now to the Figures, FIG. 1 shows an overhead view of an RF circuit 100 having an over-substrate ring for noise mitigation, in accordance with another example embodiment of the present invention. The circuit 100 includes, in a substrate level of the RF circuit 100, an (inner) well ring 120 around a device in the circuit, a deep well ring 130 around one or more devices in the circuit, and a substrate ring 140 around the deep well ring. The respective rings 120, 130 and 140 are located near a substrate region including the RF circuit.

A high frequency noise-matching ring 160 (an upper conductive ring) is located above the substrate and the rings 120, 130 and 140. The noise-matching ring 160 is configured to provide an impedance that matches an impedance at one or more devices in the RF circuit, to mitigate noise, as described herein. In some implementations, the noise-matching ring 160 compensates the transistor input capacitance and increases the gain and decreases the NF with increasing frequency. By way of example, input and output nodes of the noise-matching ring 160 are shown with input and output impedances Ginput and Goutput, and respectively facilitates the application of desirable impedance to the circuit 100.

While applicable for a single device, the example circuit configuration shown in FIG. 1 exhibits an application with three well rings 120 in rectangular form, each well ring around one or more separate devices in the RF circuit 100. As represented by the ellipses, multiple such well rings may be implemented for additional circuits. These circuits may, for example, include a transistor as discussed above, such as a first input transistor for an amplifier.

The type of the respective wells to which rings 120 and 130 pertain may vary depending upon the application. In some embodiments, the well rings 120 are coupled to a p-well and the deep well ring 130 is coupled to a deep n-well. Similarly, the substrate ring 140 may be coupled to a p-substrate or an n-substrate, depending upon the application. Accordingly, the approach as shown may be implemented with different types of devices in different well and substrate regions, as relevant to pMOS and nMOS devices.

Figure 2:
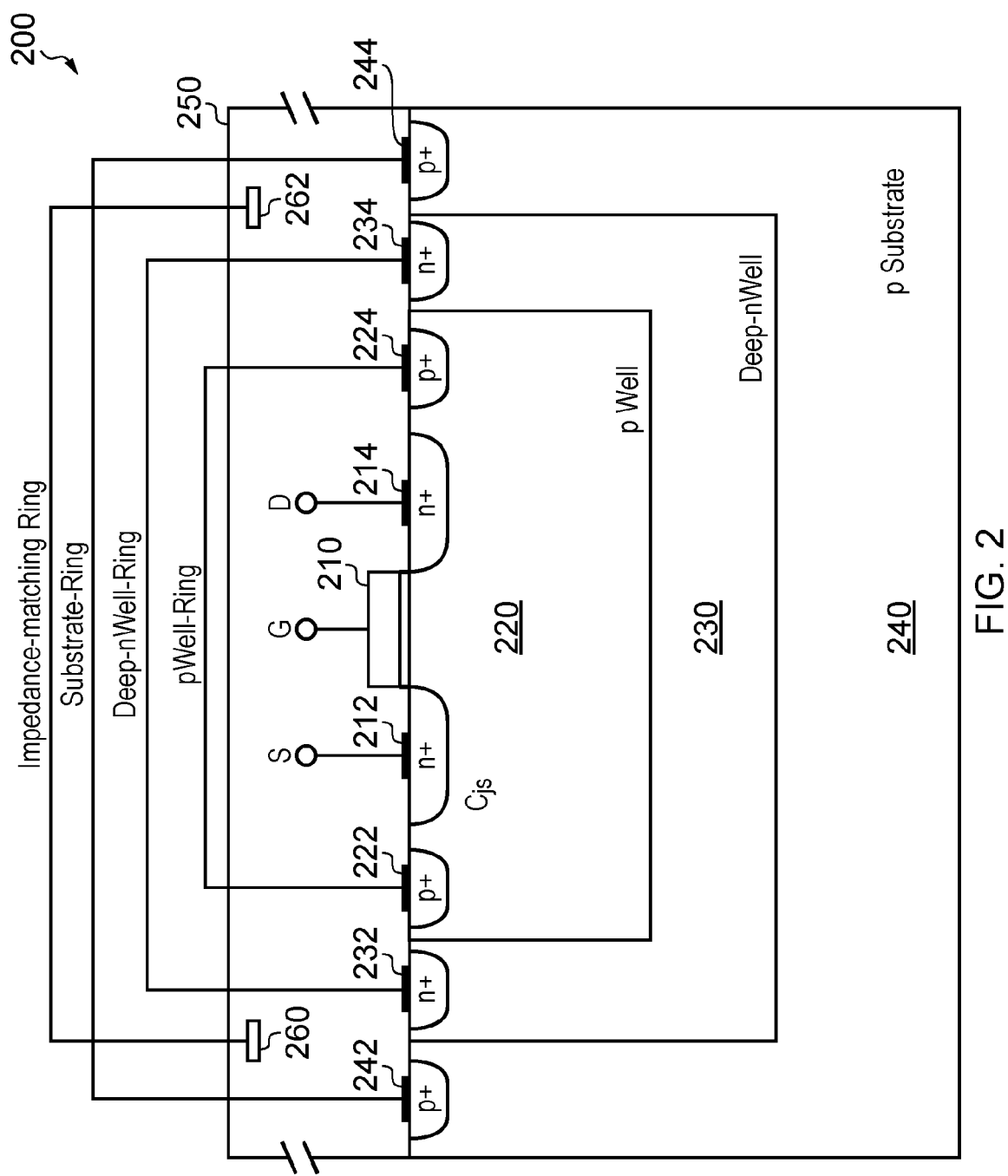
FIG. 2 shows a cross-sectional view of an RF circuit, according to another example embodiment of the present invention, according to another example embodiment of the present invention.

FIG. 2 shows a cross-sectional view of a RFMOS circuit 200, according to another example embodiment of the present invention. The RFMOS circuit 200 includes an nMOS transistor (e.g., an active circuit) having a gate 210 and source/drain regions 212 and 214 in a p-well 220, which is located in a deep n-well 230, in a p-substrate 240. Over the p-substrate are one or more additional layers as shown at 250, which may include additional insulative and/or conductive material for interconnects and/or circuitry. The deep n-well and n-well layers form isolation between the transistor p-well and the p-substrate.

The interconnection of these isolation layers is generally to the ground, and made by three substrate rings. The circuit 200 includes several substrate guard rings that provide robust substrate RF isolation for the transistor. Specifically, each of the wells and the substrate regions include conductive ring-type structures. The p-well and p-substrate rings include highly-doped p+ regions, the p-well including p+ regions 222 and 224 and the p-substrate including p+ regions 242 And 244. The deep n-well 230 has highly-doped n+ regions 232 and 234 with corresponding contacts.

Over the substrate and in one of the one or more additional layers 250, is an elevated conductive high frequency ring at 260 and 262. The elevated ring 260/262 takes advantage of the surface occupied on the underlying substrate rings of the RFMOS circuit 200 to create an input inductance in a conductive (e.g., metal) layer over the p-substrate, and this input impedance is used as a matching impedance for the impedance of an input transistor of the RFMOS circuit. The substrate ring 140 (e.g., in a first, or metal 1 layer) becomes a shield for the high frequency ring 260/262, which is fabricated in the overlying conductive layer (e.g., metal 5, metal 6 or higher, depending on the application). In some implementations, this matching impedance is further connected between the transistor gate 210 and the input of the device (e.g., a LNA). The high frequency ring 260/262 has a similar shape as the underlying substrate ring 242/244 (generally rectangular). Other embodiments involve different shapes for the high frequency ring 260/262, such as shown from an overhead view in FIG. 3 and described below.

The inductance of the high frequency ring 260/262 partially or completely matches the transistor, which can be used to set NF close to NFmin (as discussed above) for the RFMOS circuit 200. In some implementations, such as those involving a relatively large transistor size, the matching inductance required can be higher than the high frequency ring 260/262 can provide. In such applications, a second line or inductance can be added in series if the real part of equivalent overall input impedance is negligible. For general information regarding inductances, and for specific information regarding a second line/inductance, reference may be made to European patent document EP 2130297 (A1) to KIM TAE et al., December 2009, (published as WO 2008/112611 A1) which is fully incorporated herein by reference. Further, the corresponding U.S. Pat. No. 7,949,322 granted May 24, 2011 is incorporated herein by reference.

The devices and guard rings as described above in connection with FIG. 2 may be implemented and manufactured in one or more of a variety of manners. For general information regarding these approaches, and for specific information regarding circuits to which one or more embodiments may be applicable, reference may be made to U.S. Pat. No. 6,429,502 (B1) to Librizzi et al. (August 2002).

In addition, while the circuit 200 is shown in cross-section with a single transistor device, it may be implemented with a multitude of transistors and/or other devices. For instance, the circuit 200 may be implemented in accordance with the circuit 100 in the overhead view in FIG. 1, with the (inner) well ring 120, deep well ring 130 and substrate ring 140 respectively corresponding to the p-well ring 222/224, deep n-well ring 232/234 and p-substrate ring 242/244. The noise-matching ring 160 accordingly corresponds to the high frequency ring 260/262. In this context, the circuit 200 can be implemented with several transistors as shown, each transistor corresponding to a cell (within the inner well rings 120).

The inductive ring-type structures, as well as corresponding RF circuitry as described herein may be implemented in one or more of a variety of manners. In one embodiment, a transistor geometry including a gate width and length (e.g., 0.16 μm×1 μm) is selected according to LNA characteristics. Using this geometry, a target (e.g., optimal) impedance Gopt is calculated based on bias voltages, width and length of the transistor (or transistors, where several are used), as well as several process parameters such as polysilicon sheet resistances, parasitic capacitance between fingers, channel resistivity and oxide capacitance. Gopt can be also be computed using a compact model simulation approach, directly from transistor measurements and/or based upon parameters extracted during process qualification procedures. One particular example involves transistors having a gate size of 0.16 μm×1 μm with 10 fingers in 10 cells, having a total gate width of about 100 μm. The noise figure depends on the bias, and the minimum noise is generally found in saturation before the maximum gate-source voltage (Vgs). The matching impedance is then calculated for this bias voltage.

In various implementations, the width and thickness of the inductive ring-type structures are set to match desired characteristic impedances (e.g., 50 ohms), or to obtain a compromise between inductive and capacitive losses. Such losses may be determined, for example, using microstrip line theory approaches such as those described in U.S. Patent Publication 2006/0071735 (A1) to KANG (2006), which is fully incorporated herein by reference.

The length of inductive ring-type structures is determined and set as follows, in connection with one or more embodiments. The input impedance is first extracted from Gopt based on an equivalent model including series inductance (Lopt) and resistance (Ropt). Second, a series inductance (Lms) and resistance (Rms) are extracted from parameter simulations for the inductive ring-type structure (or based on calculations). The length of the line is adjusted to obtain Lms closed or equal to Lopt. If the available perimeter of rings is not sufficient to match Lopt, a more complex layout of the line can be used (e.g., FIG. 3, relative to FIG. 1), or a second inductance (line) can be added in series (e.g., outside the perimeter of an underlying RFMOS device). In addition, the series resistances of the inductive ring-type structures can be set to obtain an Rms that is less than Ropt, relative to the length determination. In some implementations, this width (as discussed above) is adjusted to obtain such a satisfactory Rms, relative to Ropt.

For general information regarding RF circuit characteristics, and for specific information regarding design approaches to which one or more example embodiments may be directed, reference may be made to Deen et al., "High-Frequency Noise of Modern MOSFETs: Compact Modeling and Measurement Issues," IEEE Transactions on Electron Devices, Volume 53, Issue 9, September 2006, pp. 2062-2081, which is fully incorporated herein by reference.

Another example embodiment is directed to an impedance-matching circuit for an RF amplifier having an input transistor on a substrate and a conductive shielding material in the substrate and laterally around at least a portion of the input transistor. The impedance matching circuit includes, in a layer of insulating material offset from the substrate and the input transistor, an impedance-matching conductive material that is insulated from the conductive shielding material, connected to a gate of the input transistor, and exhibits an impedance that matches an impedance of the input transistor. This circuit may, for example, be formed in accordance with the circuit 300 and the portion over the substrate.

Another example embodiment is directed to method of manufacturing a transceiver circuit, such as described above, using one or more of the aforesaid approaches (e.g., to set one or more of length, width or thickness). At least one insulating layer is formed over a substrate having therein a transceiver circuit and a conductive ring material laterally around the circuit. An upper conductive ring material is formed in another layer over the substrate and insulated from the conductive ring material by the insulating layer. The upper conductive ring material is configured to generate an inductance that matches impedance characteristics of the conductive ring material in the substrate. These approaches may be carried out, for example, to form a device as shown in FIG. 2, with also connecting the impedance-matching ring to the gate input 210 (e.g., as in FIG. 6).

Figure 3:
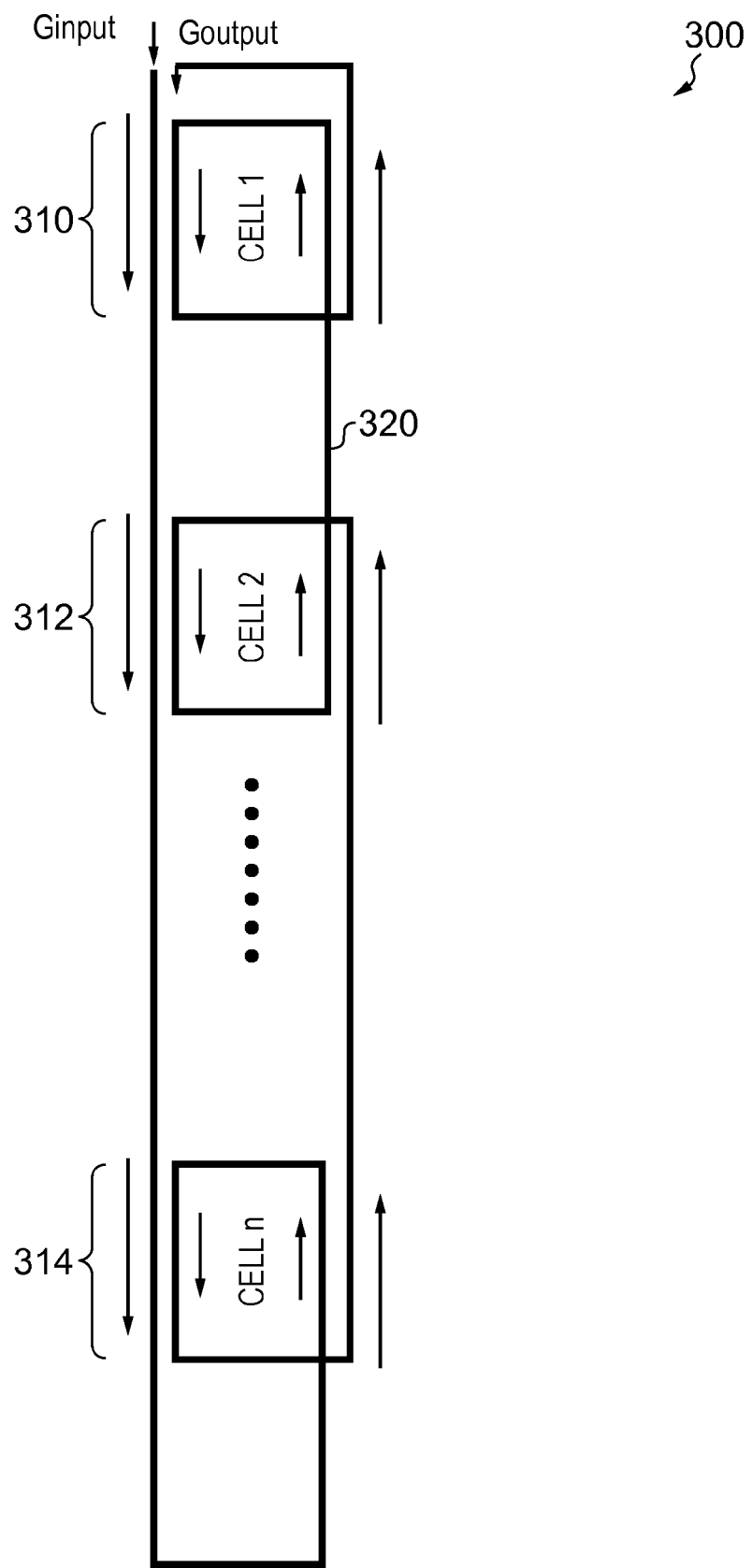
FIG. 3 shows a ring circuit with multiple transistor cells, according to another example embodiment of the present invention.

Various embodiments are directed to impedance matching ring-type circuits with various configurations. FIG. 3 shows one such ring circuit 300 with multiple transistor cells, according to another example embodiment of the present invention. As referenced above, certain embodiments are directed to impedance-matching circuits including a ring-type conductor arranged around a single circuit component, around a group of two or more circuit components, or around a mixture of single circuit components and one or more groups of circuit components (e.g., as separate rings connected together).

In consideration of the above, the circuit 300 in FIG. 3 exhibits an exemplary embodiment in which a ring-type conductor 320 has portions extending in a perimeter around all of a plurality of cells including cells 310, 312 and 314, and other portions extending around each individual cell. As represented by the ellipses, multiple such cells may be implemented in a common device. The inductance of the ring-type conductor 320 can be set based upon the length of the conductor, as set by looping around cells and by the size of such loops, as well as the mutual inductance between windings (e.g., by varying the shown conductor 320). Accordingly, the inductance can be set higher relative, for example, to a single loop as shown in FIG. 1. Higher inductances can be set to facilitate higher input inductance.

The ring-type conductor 320 is located over a substrate at one or several layers above an underlying cell. In some implementations, the ring-type conductor 320 is used with cells such as those shown in and described in connection with FIG. 2. In this context, cross-sections of the cell shown in FIG. 2 may be applicable to embodiments involving a ring-type conductor as shown in FIG. 3, with the overlying high frequency ring 260/262 having additional portions around the transistor (e.g., above p-well ring 222/224).

Figure 4:
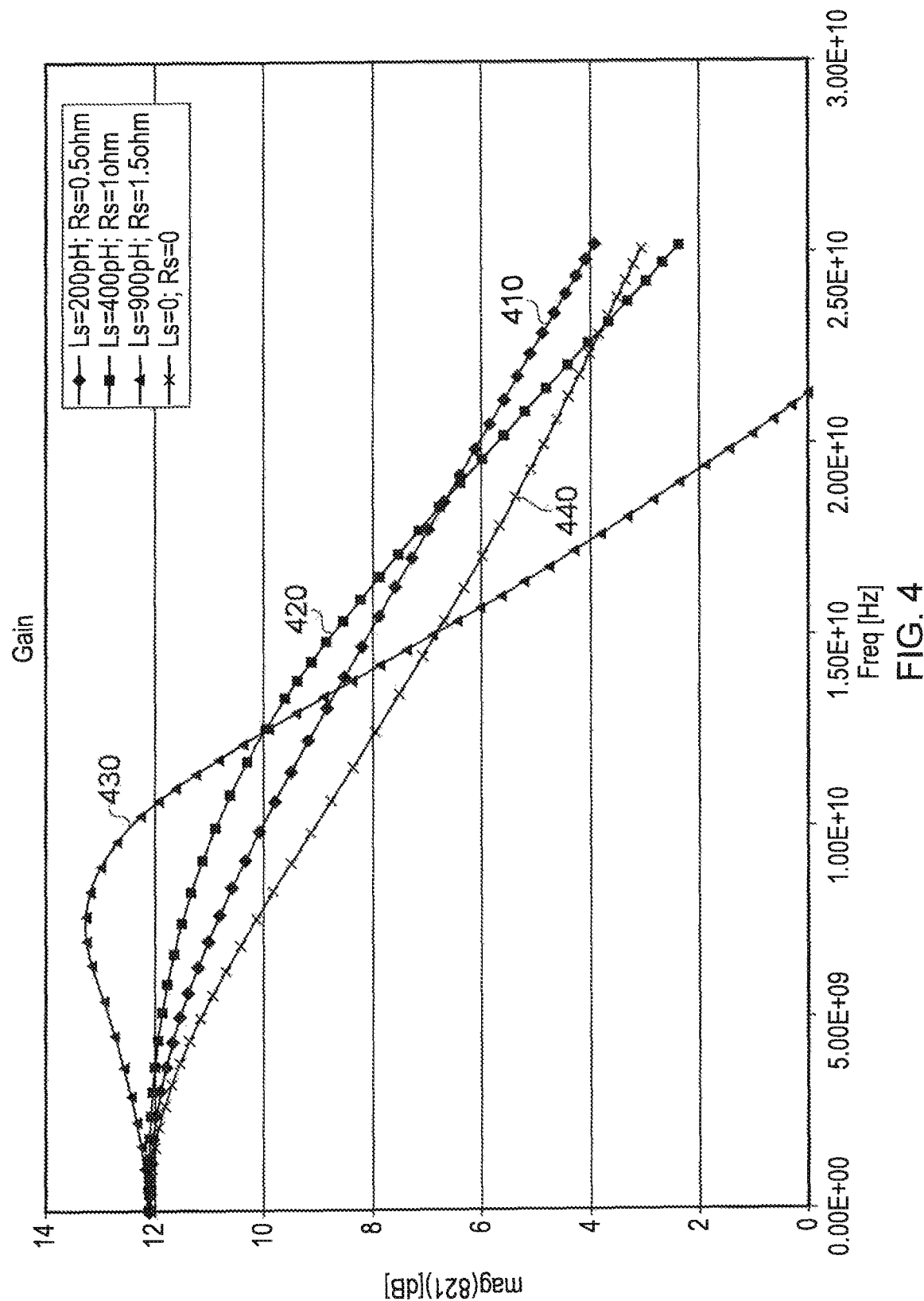
FIG. 4 shows a plot of transistor gain at various frequencies, with noise mitigated using a substrate-based ring, in accordance with one or more example embodiments.
Figure 5:
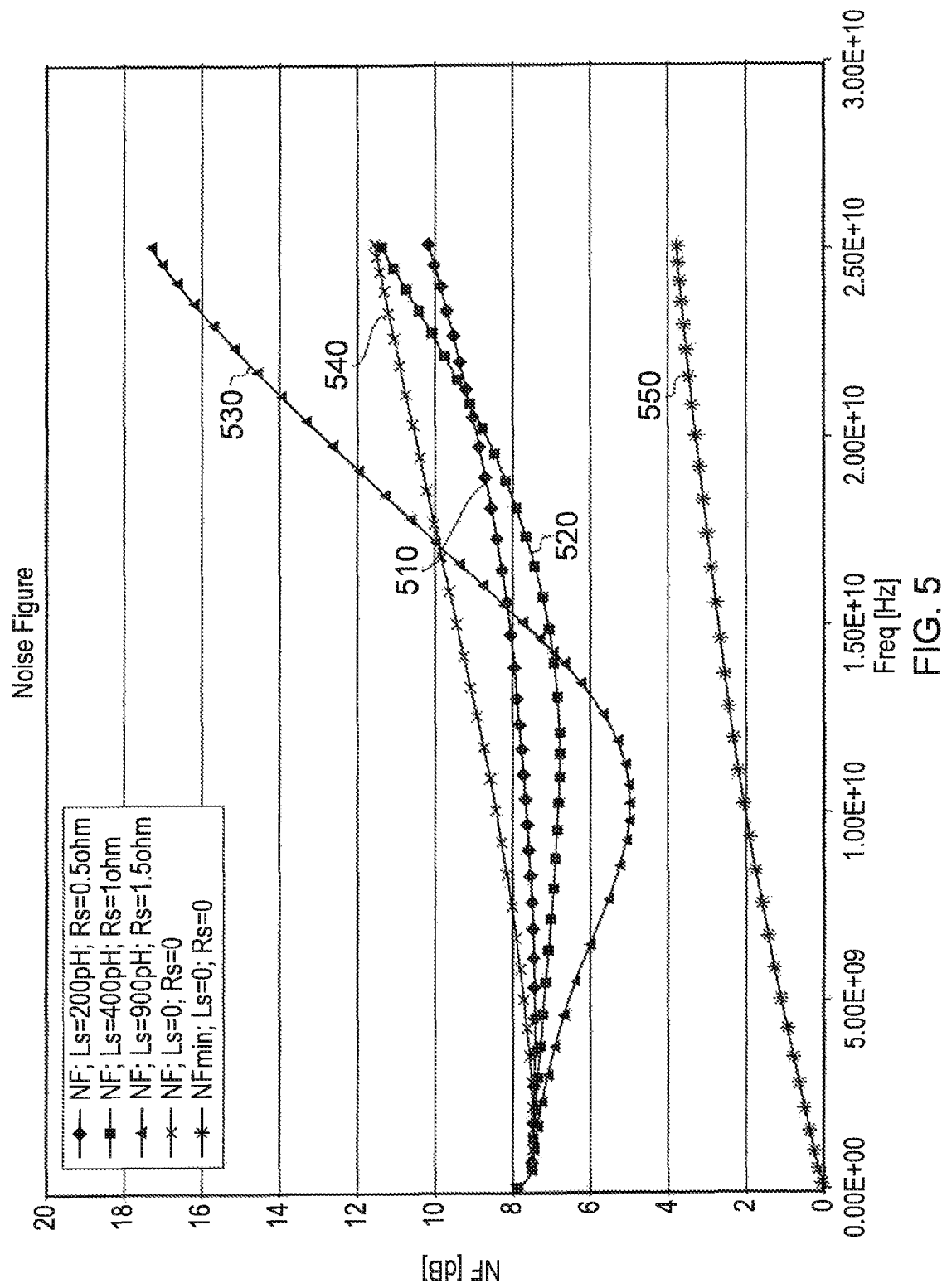
FIG. 5 shows a plot of noise at various frequencies, with noise mitigated using a substrate-based ring, in accordance with one or more example embodiments.

FIG. 4 shows a plot of transistor gain at various frequencies, with noise mitigated using a substrate-based ring, in accordance with one or more example embodiments. FIG. 5 shows a plot of noise at various frequencies, with noise mitigated using a substrate-based ring, in accordance with one or more example embodiments. One or more embodiments are directed to circuits, such as shown in the figures and/or described above, implemented in accordance with some or all of these characteristics in FIGS. 4 and 5, such as for a transistor cell having a ring-type conductor of a 230 μm length and 5 μm width.

Beginning with FIG. 4, gain is shown in the vertical axis and frequency on the horizontal axis. Plots 410, 420, 430 and 440 respectively correspond to Lms inductance values of 200 pH, 400 pH, 900 pH and 0 pH, together with corresponding resistor values as shown in the legend. Similarly in FIG. 5, plots 510, 520 and 530 respectively correspond to Lms inductance values of 200 pH, 400 pH and 900 pH, with plots 540 and 550 corresponding to an Lms inductance value of 0 pH. Plots 510-540 also correspond to the noise figure NF, and plot 550 corresponds to the minimum noise figure NFmin. An increase of signal to noise ratio is 2 dB at 10 GHz without necessarily consuming any silicon surface area. A complex inductance such as shown in FIG. 3 or a second inductance outside the device can be used to achieve more gain as shown in plots 430, 530.

The RF circuits discussed herein are applicable for use with a variety of different types of circuits and devices. For example, ring-type inductive conductors can be used in high frequency transceivers (e.g., millimeter band, anti-collision radars at 77 GHz, inter-building wireless networks at 140 GHz), tuners for TV broadcasting, and in processes with high cut-off frequencies (e.g., advanced CMOS, Bipolar, III-V process). At higher frequency, a high-frequency conductive ring as discussed herein can be used to fully match an input transistor of an amplifier without using a second input inductor.

Figure 6:
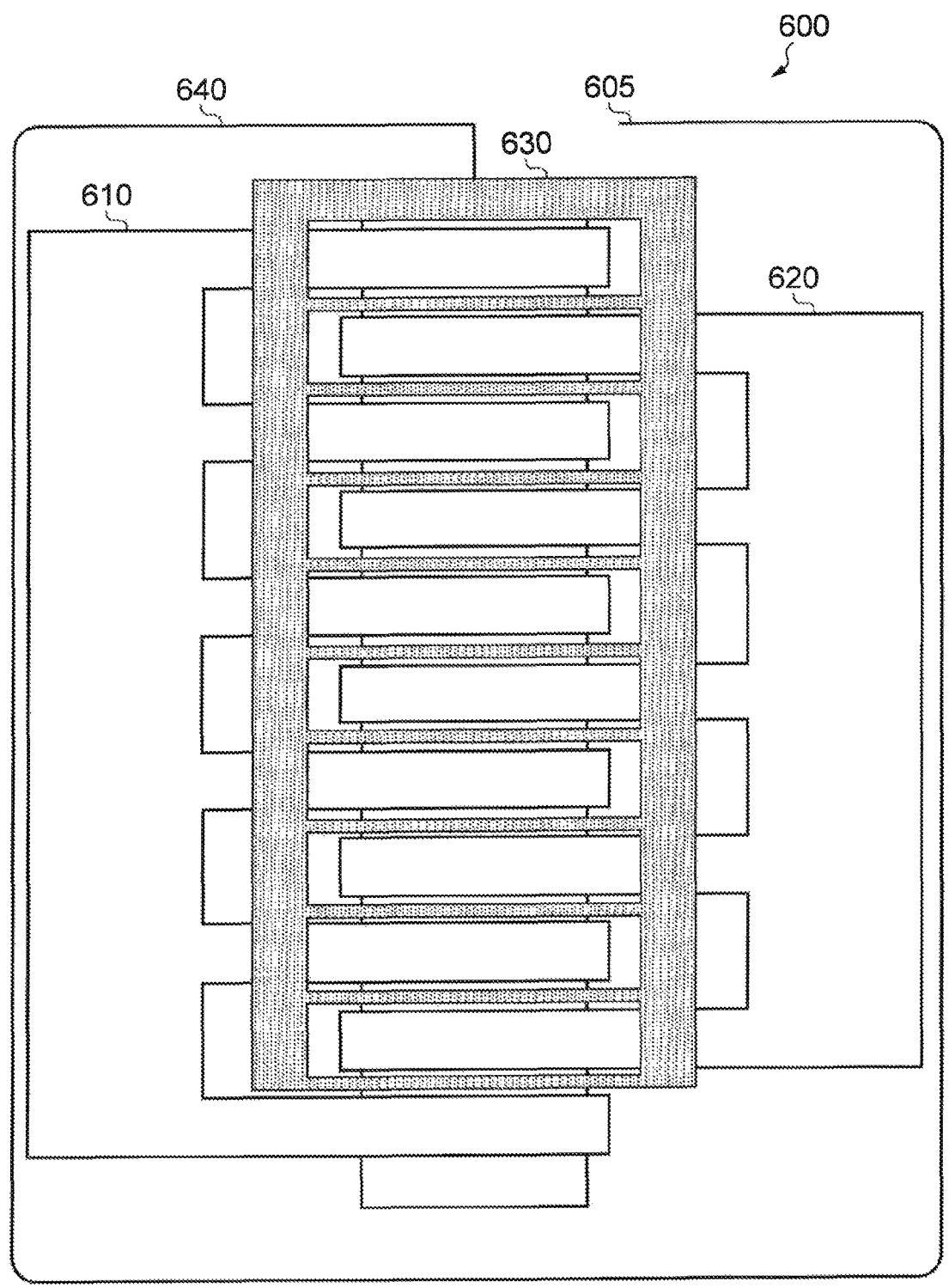
FIG. 6 shows a multi-finger RFMOS transistor, as may be implemented in accordance with one or more example embodiments.

As discussed above, a variety of RF circuits can be implemented in accordance with the embodiments discussed herein. One application involves a multi-finger RFMOS transistor 600, as shown in FIG. 6. This transistor 600 may, for example, be implemented as one of the cells shown in FIG. 3. The RFMOS transistor 600 includes multiple-finger regions including source regions 610 and drain regions 620, with a gate structure 630. A ring structure 640 is in a layer over the transistor 600, and may be implemented as shown with the ring structure 320 shown in FIG. 3. The ring structure 640 is connected to the gate 630 of a first input transistor, and acts as the input pin to the gate. Many other multi-finger types of circuits may be similarly implemented, with other and/or additional types of ring structures.

Based upon the above discussion and illustrations, those skilled in the art will readily recognize that various modifications and changes may be made to the present invention without strictly following the exemplary embodiments and applications illustrated and described herein. For example, the impedance-matching conductive ring-type structures can be implemented in a variety of shapes, with a variety of different thicknesses, lengths and configurations to suit different applications. In this context, reference to a "ring" material is not intended to require a circular shape, and instead applies to various shapes including those shown in the figures. In addition, while several embodiments (and the claims) refer to spatial terms such as an "upper" conductive material, such terms are illustrative relative to the arrangement and spacing of the conductive materials (e.g., the "upper" conductive material being offset one to several layers apart from a substrate-based ring material), and are thus applicable to other arrangements such as those involving lateral spacing (right to left), angles of rotation or reverse orientation in which the substrate is over the offset ring. Such modifications do not depart from the true spirit and scope of the present invention, including that set forth in the following claims.

The invention claimed is:

1. A radio frequency circuit comprising:
   a substrate;
   an active circuit in the substrate;
   adjacent the active circuit and in the substrate, a conductive ring material around at least a portion of the active circuit;
   at least one insulating layer over the substrate; and
   in another layer over the substrate, an upper conductive ring material insulated from the conductive ring material by the insulating layer, and configured to generate an inductance that matches input impedance characteristics of the active circuit;

wherein the active circuit includes a plurality of transistors including a first input transistor of a low noise amplifier circuit, and the upper conductive ring material is configured in thickness and length to generate an inductance that matches an inductance of the first input transistor, or includes an end electrically connected to the gate of the first input transistor and another end of the upper conductive ring material is an input pin for the gate, the upper conductive ring material being configured to generate an inductance that matches an inductance of the first input transistor.

2. The circuit of claim 1, wherein the upper conductive ring material is electrically connected to a gate of an input transistor of the active circuit and matches the impedance of the input transistor.

3. The circuit of claim 1, wherein the active circuit includes a plurality of cells, each cell having a transistor, and the upper conductive ring material extends laterally around a periphery of:

all of the plurality of cells, or each of the individual cells, or each of the individual cells and around a periphery of all of the plurality of cells.

4. The circuit of claim 1, wherein the upper conductive ring material is configured to generate an inductance that matches a capacitance of the active circuit.

5. The circuit of claim 1, wherein the active circuit includes a multi-finger RFMOS transistor, and the upper conductive ring material is configured to generate an inductance that matches an inductance of the multi-finger RFMOS transistor.

* * * * *